United States Patent
Aso et al.

(10) Patent No.: US 9,622,381 B2
(45) Date of Patent: Apr. 11, 2017

(54) ADSORPTION HEAT PUMP AND METHOD OF DRIVING THE SAME

(71) Applicant: FUJITSU LIMITED, Kawasaki-shi, Kanagawa (JP)

(72) Inventors: Noriyasu Aso, Isehara (JP); Toshio Manabe, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 521 days.

(21) Appl. No.: 14/217,727

(22) Filed: Mar. 18, 2014

(65) Prior Publication Data

US 2014/0260359 A1 Sep. 18, 2014

(30) Foreign Application Priority Data

Mar. 18, 2013 (JP) .................................. 2013-054561
Dec. 17, 2013 (JP) .................................. 2013-259809

(51) Int. Cl.
*F25B 17/00* (2006.01)
*H05K 7/20* (2006.01)
*F25B 17/08* (2006.01)

(52) U.S. Cl.
CPC ....... *H05K 7/20363* (2013.01); *F25B 17/083* (2013.01); *H05K 7/20827* (2013.01); *Y02B 30/62* (2013.01); *Y02B 30/64* (2013.01)

(58) Field of Classification Search
CPC ...... F25B 30/04; F25B 17/083; F25B 17/086; Y02B 30/62
See application file for complete search history.

(56) References Cited

U.S. PATENT DOCUMENTS

| | | | | |
|---|---|---|---|---|
| 3,254,499 A | * | 6/1966 | Hopkins | ................. F25B 15/06 62/104 |
| 6,615,603 B2 | | 9/2003 | Tanaka | |
| 8,539,782 B2 | * | 9/2013 | Buttner | ................. F25B 17/083 62/101 |

FOREIGN PATENT DOCUMENTS

| | | |
|---|---|---|
| JP | H10-300271 | 11/1998 |
| JP | 2002-100891 A1 | 4/2002 |
| JP | 2009-121740 A1 | 6/2009 |

* cited by examiner

*Primary Examiner* — Cassey D Bauer
(74) *Attorney, Agent, or Firm* — Kratz, Quintos & Hanson, LLP

(57) ABSTRACT

An adsorption heat pump includes: an evaporator configured to generate coolant vapor; a first adsorber and a second adsorber each containing an adsorbent to adsorb the coolant vapor generated in the evaporator; a condenser configured to condense the coolant vapor generated in any of the first adsorber and the second adsorber; and a control unit. The control unit feeds the condenser with cooling water for condensation of the coolant vapor and feeds the condenser with warm water for evaporation of the coolant at predetermined timing.

7 Claims, 21 Drawing Sheets

FIG. 3

| CYCLE → | FIRST STEP | RESTORATION STEP | SECOND STEP | RESTORATION STEP | FIRST STEP | RESTORATION STEP | SECOND STEP | RESTORATION STEP | ..... |
|---|---|---|---|---|---|---|---|---|---|
| ADSORBER 13a | WARM WATER | COOLING WATER | COOLING WATER | COOLING WATER | WARM WATER | COOLING WATER | COOLING WATER | COOLING WATER | ..... |
| ADSORBER 13b | COOLING WATER | WARM WATER | WARM WATER | WARM WATER | COOLING WATER | WARM WATER | WARM WATER | WARM WATER | |
| CONDENSER 12 | COOLING WATER | WARM WATER | COOLING WATER | WARM WATER | COOLING WATER | WARM WATER | COOLING WATER | WARM WATER | |

FIG. 10

| | CYCLE → | | | | | | | | | | | |
|---|---|---|---|---|---|---|---|---|---|---|---|---|
| | FIRST STEP | SECOND STEP | | | FIRST STEP | SECOND STEP | | | FIRST STEP | SECOND STEP | | |
| | | | | RESTORATION STEP | | | | RESTORATION STEP | | | | RESTORATION STEP |
| ADSORBER 13a | WARM WATER | COOLING WATER | | COOLING WATER | WARM WATER | COOLING WATER | | COOLING WATER | WARM WATER | COOLING WATER | | COOLING WATER |
| ADSORBER 13b | COOLING WATER | WARM WATER | | WARM WATER | COOLING WATER | WARM WATER | | WARM WATER | COOLING WATER | WARM WATER | | WARM WATER |
| CONDENSER 12 | COOLING WATER | COOLING WATER | | WARM WATER | COOLING WATER | COOLING WATER | | WARM WATER | COOLING WATER | COOLING WATER | | WARM WATER |

FIG. 12

| | CYCLE → | | | | | | | | | |
|---|---|---|---|---|---|---|---|---|---|---|
| | FIRST STEP | SECOND STEP | FIRST STEP | .... | RESTORATION STEP | FIRST STEP | SECOND STEP | FIRST STEP | .... | RESTORATION STEP |
| ADSORBER 13a | WARM WATER | COOLING WATER | WARM WATER | .... | COOLING WATER | WARM WATER | COOLING WATER | WARM WATER | .... | COOLING WATER |
| ADSORBER 13b | COOLING WATER | WARM WATER | COOLING WATER | .... | WARM WATER | COOLING WATER | WARM WATER | COOLING WATER | .... | WARM WATER |
| CONDENSER 12 | COOLING WATER | COOLING WATER | COOLING WATER | | WARM WATER | COOLING WATER | COOLING WATER | COOLING WATER | | WARM WATER |

FIG. 17

| | CYCLE → | | | ... | | | | | | | | ... |
|---|---|---|---|---|---|---|---|---|---|---|---|---|
| | FIRST STEP | SECOND STEP | | | FIRST STEP | SECOND STEP | | | FIRST STEP | | | |
| | | | | | | | RESTORATION STEP | | | | RESTORATION STEP | |
| ADSORBER 13a | WARM WATER | COOLING WATER | | | WARM WATER | COOLING WATER | COOLING WATER | | WARM WATER | COOLING WATER | COOLING WATER | ... |
| ADSORBER 13b | COOLING WATER | WARM WATER | | | COOLING WATER | WARM WATER | WARM WATER | | COOLING WATER | WARM WATER | WARM WATER | |
| CONDENSER (HEAT EXCHANGER 12a) | COOLING WATER | COOLING WATER | | | COOLING WATER | COOLING WATER | WARM WATER | | COOLING WATER | COOLING WATER | COOLING WATER | |
| CONDENSER (HEAT EXCHANGER 12b) | COOLING WATER | COOLING WATER | | | COOLING WATER | COOLING WATER | COOLING WATER | | COOLING WATER | COOLING WATER | WARM WATER | |

ADSORPTION HEAT PUMP AND METHOD OF DRIVING THE SAME

CROSS-REFERENCE TO RELATED APPLICATION

This application is based upon and claims the benefit of priority of the prior Japanese Patent Application No. 2013-054561, filed on Mar. 18, 2013, and the Japanese Patent Application No. 2013-259809, filed on Dec. 17, 2013, the entire contents of which are incorporated herein by reference.

FIELD

The embodiments discussed herein are related to an adsorption heat pump and a method of driving the same.

BACKGROUND

In recent years, a large quantity of data have been handled by computers with the advent of an advanced information society, and numerous computers have often been installed and managed collectively in one room in a facility such as a data center. In a data center, for example, numerous racks (server racks) are installed in a computer room and a plurality of computers (servers) are housed in each rack. Then, a large amount of jobs are efficiently processed by being organically distributed to the computers depending on operation statues of the computers.

A large amount of heat is generated from the computers along with the operation of the computers. A rise in temperature in each computer leads to an error or malfunction. Accordingly, it is important to cool the computers. In the data center, a large amount of electric power is used for cooling electronic equipment such as the computers.

On the other hand, there is a demand for reductions in power consumption by data centers from the viewpoint of energy saving. In this regard, there have been proposed techniques to recover heat (waste heat) emitted from electronic equipment such as computers and to recycle the heat as energy.

In general, the temperature of heat recovered from electronic equipment such as computers is equal to or below 90° C. Here, cool water usable for air conditioning or cooling the electronic equipment, for example, may be obtained by using an adsorption heat pump (AHP) which utilizes the waste heat at 90° C. or below.

Patent Document 1: Japanese Laid-open Patent Publication No. 2002-100891
Patent Document 2: Japanese Laid-open Patent Publication No. 2009-121740
Patent Document 3: Japanese Laid-open Patent Publication No. 10-300271

SUMMARY

According to an aspect of the techniques disclosed herein, there is provided an adsorption heat pump which includes: an evaporator configured to generate vapor of a coolant; a first adsorber and a second adsorber each containing an adsorbent to adsorb the vapor of the coolant generated in the evaporator; a condenser configured to condense the vapor of the coolant generated in any of the first adsorber and the second adsorber; and a control unit configured to feed the condenser with cooling water for condensation of the vapor of the coolant, and to feed the condenser with warm water for evaporation of the coolant at predetermined timing.

According to another aspect of the techniques disclosed herein, there is provided a method of driving an adsorption heat pump provided with: an evaporator configured to generate vapor of a coolant; a first adsorber and a second adsorber each containing an adsorbent to adsorb the vapor of the coolant generated in the evaporator; and a condenser configured to condense the vapor of the coolant generated in any of the first adsorber and the second adsorber, the method including: supplying the condenser with cooling water for condensation of the vapor of the coolant; and supplying the condenser with warm water for evaporation of the coolant.

According to still another aspect of the techniques disclosed herein, there is provided a method of driving an adsorption heat pump provided with: an evaporator configured to generate vapor of a coolant; a first adsorber and a second adsorber each containing an adsorbent to adsorb the vapor of the coolant generated in the evaporator; and a condenser including a first heat exchanger and a second heat exchanger, and configured to condense the vapor of the coolant generated in any of the first adsorber and the second adsorber, the method including: supplying both the first heat exchanger and the second heat exchanger with cooling water for condensation of the vapor of the coolant; and supplying any one of the first heat exchanger and the second exchanger with warm water for evaporation of the coolant, and supplying the other one of the first heat exchanger and the second exchanger with the cooling water for condensation of the coolant vapor.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3 is a cycle diagram illustrating a first driving method of the adsorption heat pump according to the first embodiment;

FIG. 10 is a cycle diagram illustrating a second driving method of the adsorption heat pump according to the first embodiment;

FIG. 12 is a cycle diagram illustrating a method of driving the adsorption heat pump according to the second embodiment;

FIG. 17 is a cycle diagram illustrating a method of driving the adsorption heat pump according to the third embodiment;

DESCRIPTION OF EMBODIMENTS

Figure 1:
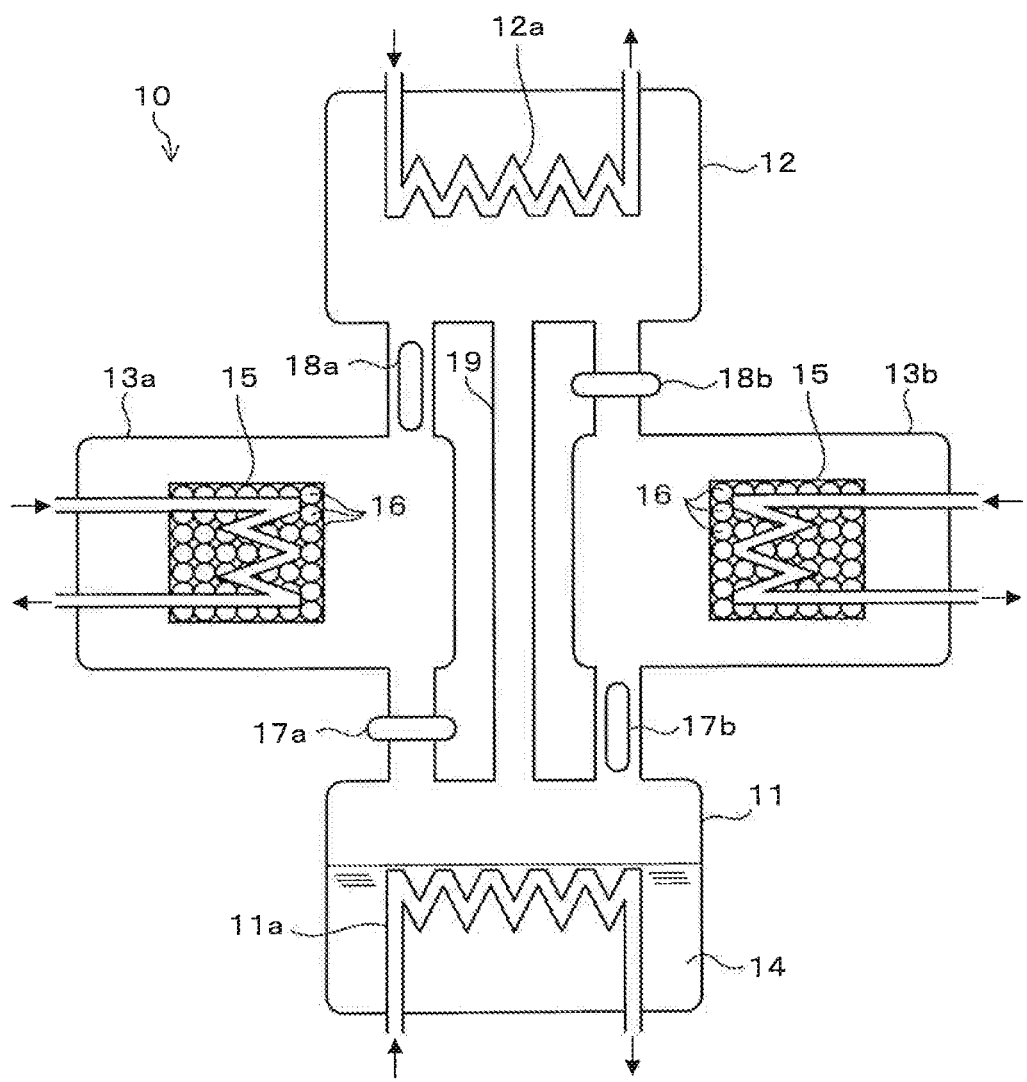
FIG. 1 is a schematic diagram of a main body portion of an adsorption heat pump according to a first embodiment.

Preliminary matter for facilitating understanding of embodiments will be explained below prior to description of the embodiments.

A typical adsorption heat pump includes an evaporator, a condenser placed above the evaporator, and two adsorbers placed in parallel with each other and between the evaporator and the condenser. A cool water pipe to allow passage of cool water, and a liquid coolant are placed in the evaporator. For example, water or methanol is used as the coolant.

The adsorption heat pump cools water passing through the cool water pipe, by using an action of the coolant to draw latent heat from the water when the coolant evaporates in the evaporator. The cool water supplied from the cool water pipe is used for indoor air conditioning, cooling electronic equipment, and so forth.

Coolant vapor generated in the evaporator is adsorbed by an adsorbent placed in the adsorbers. For example, silica gel or zeolite is used as the adsorbent.

While one of the adsorbers is adsorbing the coolant vapor, warm water warmed by heat (waste heat) generated by electronic equipment and the like is supplied to the other adsorber and the adsorbent therein is dried (recycled) with the warm water.

The coolant vapor generated in association with the drying of the adsorbent moves to the condenser. A heat exchanger is placed in the condenser and cooling water is supplied to the heat exchanger. The coolant vapor having moved into the condenser is cooled, condensed, and turned into a liquid by the cooling water passing inside the heat exchanger. The liquid passes through piping and moves to the evaporator.

Meanwhile, in order to improve a cold heat output (a cool water supply capacity) of the adsorption heat pump, it is preferable to increase an amount of the coolant per unit time to be condensed in the condenser. A conceivable option for this goal is to provide a larger heat exchanger in the condenser.

In this case, however, the provision of the larger heat exchanger leads to an increase in size of the condenser whereby a position to install the adsorption heat pump may be limited. As a consequence, it may be difficult to install the adsorption heat pump inside a server rack, for instance.

In general, the heat exchanger placed in the condenser is provided with fins. Heat exchange efficiency of the heat exchanger is related to the surface area of the fins. In this regard, the number of the fins may possibly be increased by reducing an arrangement pitch of the fins in order to increase an amount of condensation of the vapor without changing the size of the heat exchanger.

However, if the arrangement pitch of the fins is set too narrow, the liquid generated as a result of the condensation may remain between the fins due to its surface tension whereby entry of the vapor in spaces between the fins may be inhibited. As a consequence, the heat exchange efficiency of the heat exchanger may be degraded and the cold heat output of the adsorption heat pump may be reduced.

The following embodiments will describe an adsorption heat pump which has a small size and a large cold heat output, and a method of driving the adsorption heat pump.

1. First Embodiment

FIG. 1 is a schematic diagram of a main body portion of an adsorption heat pump according to a first embodiment.

As illustrated in FIG. 1, an adsorption heat pump 10 of this embodiment includes an evaporator 11, a condenser 12 placed above the evaporator 11, and adsorbers 13a and 13b placed in parallel with each other and between the evaporator 11 and the condenser 12. A space inside the adsorption heat pump 10 has a reduced pressure of about $\frac{1}{100}$ kPa, for example.

A coolant 14 is stored in the evaporator 11. In addition, a cool water pipe 11a to allow passage of cool water is provided in the evaporator 11. As described previously, water or methanol is used as the coolant 14 in the case of a typical adsorption heat pump. In this embodiment, water is used as the coolant 14. Note that a substance other than water may be used as the coolant 14.

A heat exchanger 15 containing an adsorbent (a desiccant) 16 is placed in each of the adsorbers 13a and 13b. As will be described later, warm water and cooling water are alternately supplied to the heat exchangers 15.

The adsorber 13a is connected to the evaporator 11 through a valve 17a, and the adsorber 13b is connected to the evaporator 11 through a valve 17b.

A heat exchanger 12a for condensing coolant vapor is placed in the condenser 12. The cooling water is supplied to the heat exchanger 12a. However, the warm water is supplied thereto in a restoration step as will be described later.

A valve 18a is placed between the condenser 12 and the adsorber 13a. A valve 18b is placed between the condenser 12 and the adsorber 13b.

The valves 17a, 17b, 18a, and 18b are opened and closed in accordance with electric signals outputted from a control unit 30 to be described later. Meanwhile, the condenser 12 is connected to the evaporator 11 through a pipe 19.

Figure 2:
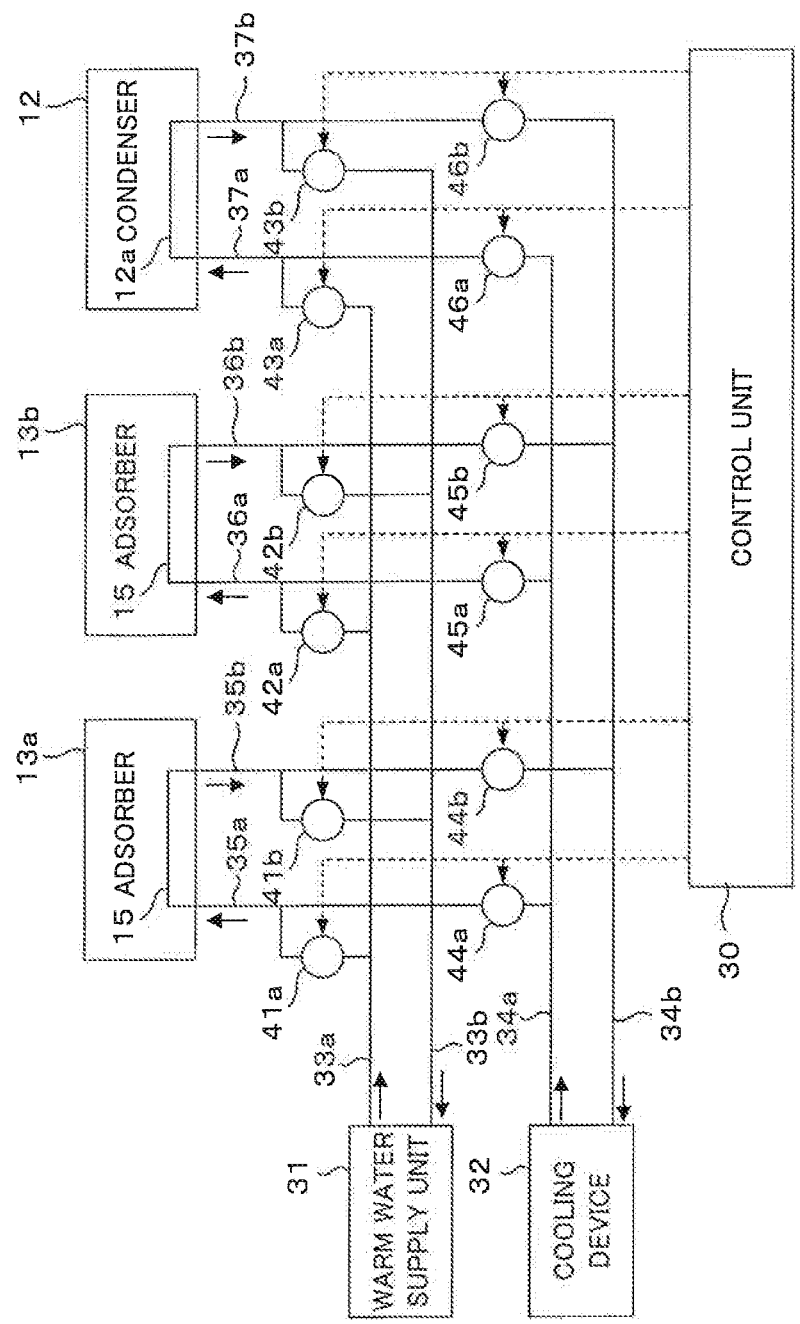
FIG. 2 is a schematic diagram illustrating a control system of the adsorption heat pump according to the first embodiment.

FIG. 2 is a schematic diagram illustrating a control system of the adsorption head pump 10 of this embodiment.

In FIG. 2, a warm water supply unit 31 is a portion configured to supply the warm water which is warmed by the heat (the waste heat) generated by the electronic equipment and the like. Here, a temperature of the warm water to be supplied from the warm water supply unit 31 is around 70° C. However, the temperature of the warm water supplied from the warm water supply unit 31 is not limited to the aforementioned temperature.

A cooling device 32 is a portion configured to cool the cooling water to be supplied to the adsorbers 13a and 13b and the condenser 12. If an amount of power consumed by the cooling device 32 is large, an energy saving effect obtained by use of the adsorption heat pump is reduced. For this reason, in this embodiment, a sprinkler type cooling tower which consumes relatively low power is used as the cooling device 32.

Here, a temperature of the cooling water to be supplied from the cooling device 32 is around 25° C. However, the cooling device 32 is not limited to the sprinkler type cooling tower and the temperature of the cooling water supplied from the cooling device 32 is not limited to the aforementioned temperature.

As illustrated in FIG. 2, an inlet side pipe 35a of the adsorber 13a is connected to a warm water supply pipe 33a, which allows passage of the warm water supplied from the warm water supply unit 31, through a valve 41a. Meanwhile, the inlet side pipe 35a of the adsorber 13a is connected to a cooling water supply pipe 34a, which allows passage of the cooling water supplied from the cooling device 32, through a valve 44a.

Moreover, an outlet side pipe 35b of the adsorber 13a is connected to a warm water return pipe 33b, which allows passage of the warm water returning to the warm water supply unit 31, through a valve 41b. Furthermore, the outlet side pipe 35b of the adsorber 13a is connected to a cooling water return pipe 34b, which allows passage of the cooling water returning to the cooling device 32, through a valve 44b.

Similarly, an inlet side pipe 36a of the adsorber 13b is connected to the warm water supply pipe 33a through a valve 42a. The inlet side pipe 36a of the adsorber 13b is connected to the cooling water supply pipe 34a through a valve 45a.

Moreover, an outlet side pipe 36b of the adsorber 13b is connected to the warm water return pipe 33b through a valve 42b. The outlet side pipe 36b of the adsorber 13b is connected to the cooling water return pipe 34b through a valve 45b.

Meanwhile, an inlet side pipe 37a of the condenser 12 is connected to the warm water supply pipe 33a through a valve 43a. The inlet side pipe 37a of the condenser 12 is connected to the cooling water supply pipe 34a through a valve 46a.

Moreover, an outlet side pipe 37b of the condenser 12 is connected to the warm water return pipe 33b through a valve 43b. The outlet side pipe 37b of the condenser 12 is connected to the cooling water return pipe 34b through a valve 46b.

The valves 41a, 41b, 42a, 42b, 43a, 43b, 44a, 44b, 45a, 45b, 46a, and 46b are opened and closed in accordance with signals outputted from the control unit 30.

A method of driving the above-described adsorption heat pump 10 will be explained below.

In the following explanation, a period when the warm water is supplied to the adsorber 13a, the cooling water is supplied to the adsorber 13b, and the cooling water is supplied to the condenser 12 will be referred to as a first step. Meanwhile, a period when the cooling water is supplied to the adsorber 13a, the warm water is supplied to the adsorber 13b, and the cooling water is supplied to the condenser 12 will be referred to as a second step. Further, a period when the warm water is supplied to the condenser 12 will be referred to as a restoration step.

(First Driving Method) FIG. 3 is a cycle diagram illustrating a first driving method of the adsorption heat pump 10.

In order to execute the first step, the control unit 30 closes the valve 17a between the adsorber 13a and the evaporator 11, and the valve 18b between the adsorber 13b and the condenser 12 to begin with. In addition, the control unit 30 opens the valve 17b between the adsorber 13b and the evaporator 11, and the valve 18a between the adsorber 13a and the condenser 12 (see FIG. 1).

Figure 4:
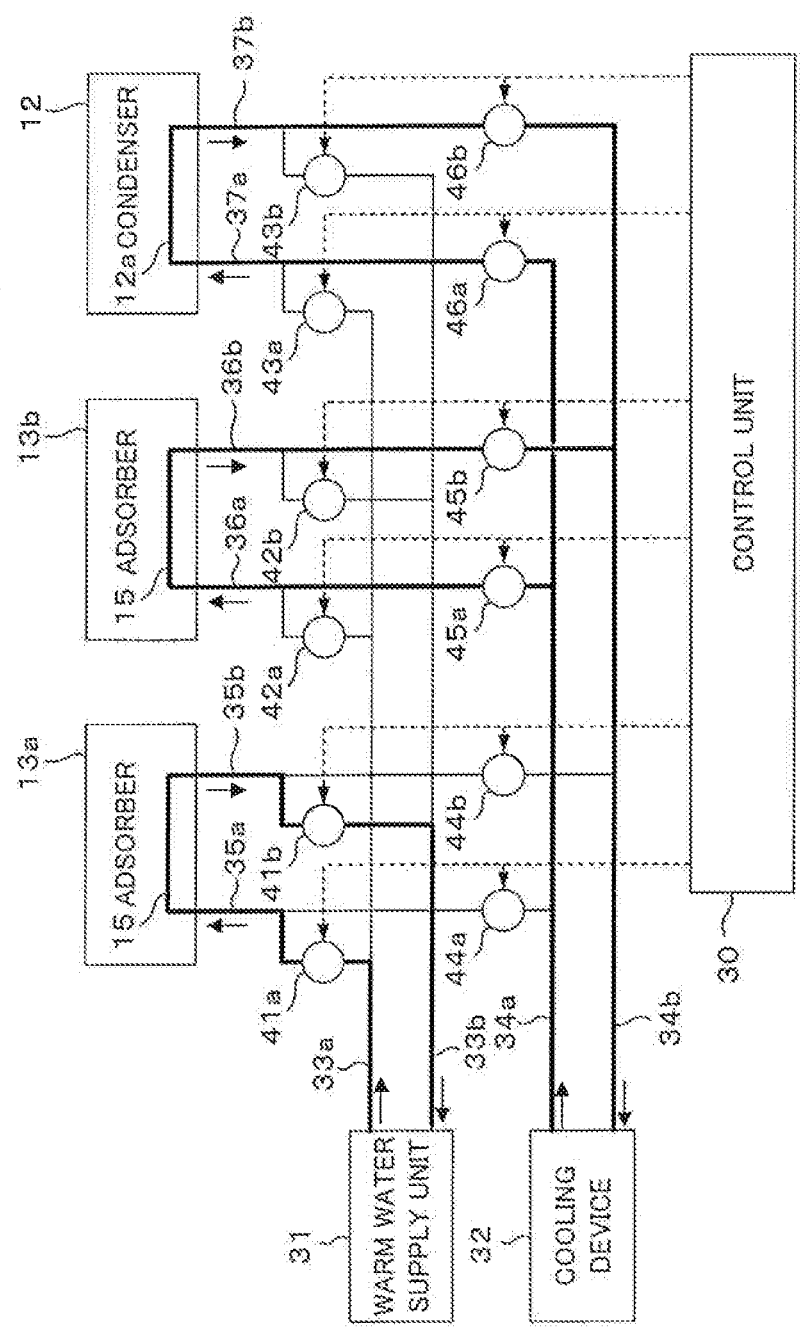
FIG. 4 is a diagram illustrating flow passages of warm water and cooling water in a first step.

Further, the control unit 30 opens the valves 41a, 41b, 45a, 45b, 46a, and 46b, and closes the valves 42a, 42b, 43a, 43b, 44a, and 44b. Thus, as illustrated in FIG. 4, the warm water is supplied to the adsorber 13a while the cooling water is supplied to the adsorber 13b and the condenser 12.

In the adsorber 13b, a pressure inside the adsorber 13b decreases in association with adsorption of moisture in an atmosphere by the adsorbent 16 therein. Since the valve 17b between the adsorber 13b and the evaporator 11 is opened, a pressure inside the evaporator 11 also decreases, whereby the water stored in the evaporator 11 evaporates and thus draws latent heat through the cool water pipe 11a.

As a consequence, the temperature of the water passing inside the cool water pipe 11a drops and the cool water is supplied from the cool water pipe 11a. The cool water is used for indoor air conditioning, cooling the electronic equipment, and so forth. Water vapor generated in the evaporator 11 enters the adsorber 13b through the valve 17b, and is adsorbed by the adsorbent 16 therein.

Here, the adsorbent 16 generates heat in association with the adsorption of the moisture. The moisture adsorption efficiency of the adsorbent 16 is degraded with the rise in temperature thereof. However, in this embodiment, the adsorbent 16 is cooled by the cooling water flowing inside the heat exchanger 15.

Meanwhile, in the adsorber 13a, a temperature of the adsorbent 16 therein rises by use of the warm water supplied to the heat exchanger 15, and the moisture adsorbed by the adsorbent 16 is turned into water vapor and leaves the adsorbent 16. Thus, the adsorbent 16 is dried (recycled). The water vapor generated in the adsorber 13a passes through the opened valve 18a and enters the condenser 12.

The water vapor having entered the condenser 12 from the adsorber 13a is cooled by the cooling water passing inside the heat exchanger 12a and is turned into a liquid. The liquid moves to the evaporator 11 through the pipe 19.

Figure 5:
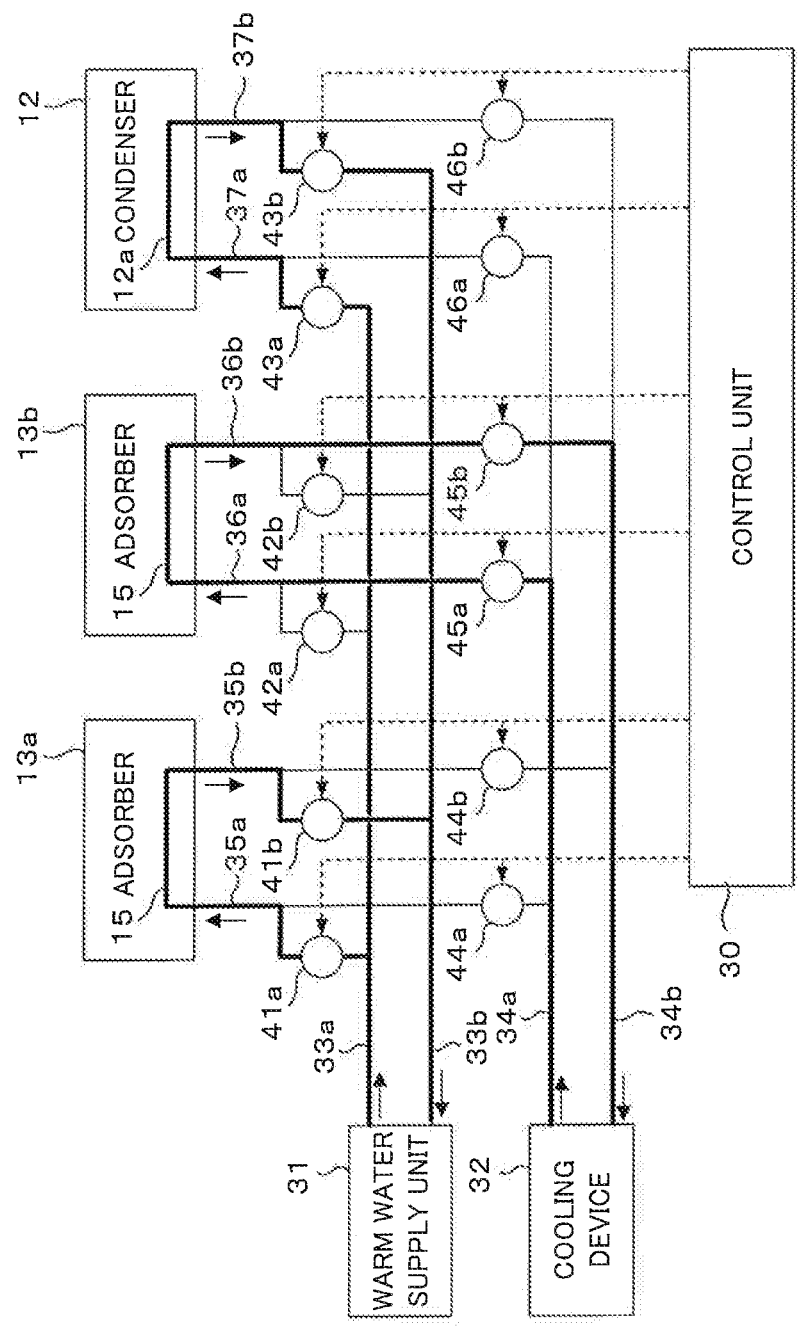
FIG. 5 is a diagram illustrating flow passages of the warm water and the cooling water in a restoration step subsequent to the first step.

After an elapse of a predetermined period from the start of the first step, the control unit 30 closes the valves 46a and 46b and opens the valves 43a and 43b in order to proceed to the restoration step. Thus, as illustrated in FIG. 5, the warm water flows through the heat exchanger 12a of the condenser 12. In the restoration step, the opened and closed states of the rest of the valves remain the same as in the previous step.

Figure 6A:
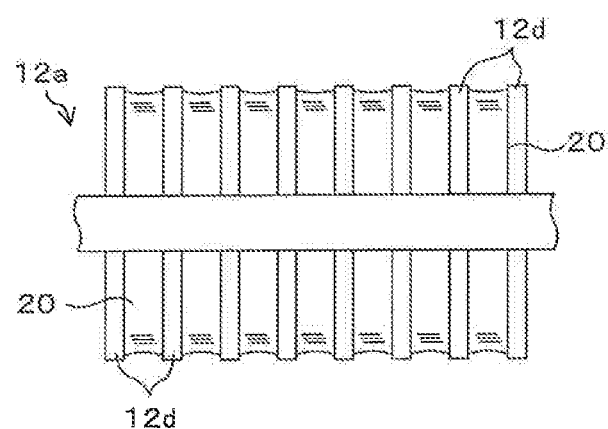
FIGS. 6A and 6B are views illustrating states of fins of a heat exchanger before the restoration step and after the restoration step.
Figure 6B:
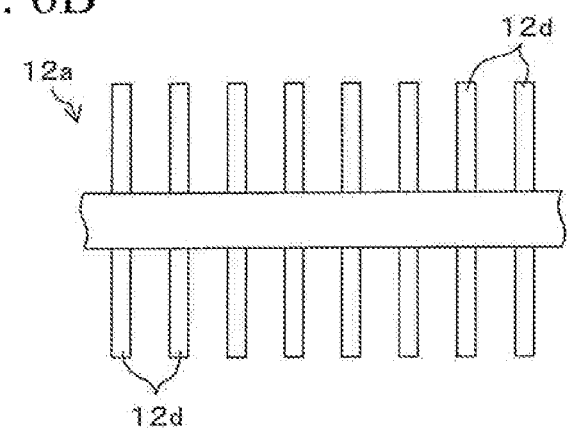

As a consequence of the condensation of the water vapor inside the condenser 12, a large amount of moisture 20 adheres to spaces between fins 12d of the heat exchanger 12a as illustrated in FIG. 6A, for example, and heat exchange efficiency of the heat exchanger 12a thereby decreases. However, the moisture 20 adhering to the fins 12d either evaporates as a result of causing the warm water to flow inside the heat exchanger 12a in the restoration step, or drips off by vibration of the moisture 20 associated with the evaporation. Thus, the moisture 20 adhering to the fins 12d is removed as illustrated in FIG. 6B, whereby the heat exchange efficiency of the heat exchanger 12a is restored.

Here, the water vapor generated in the condenser 12 passes through the pipe 19 and moves toward the evaporator 11 by means of a difference in vapor pressure. Then, the water vapor is condensed into a liquid either inside the pipe 19 or inside the evaporator 11.

Figure 7:
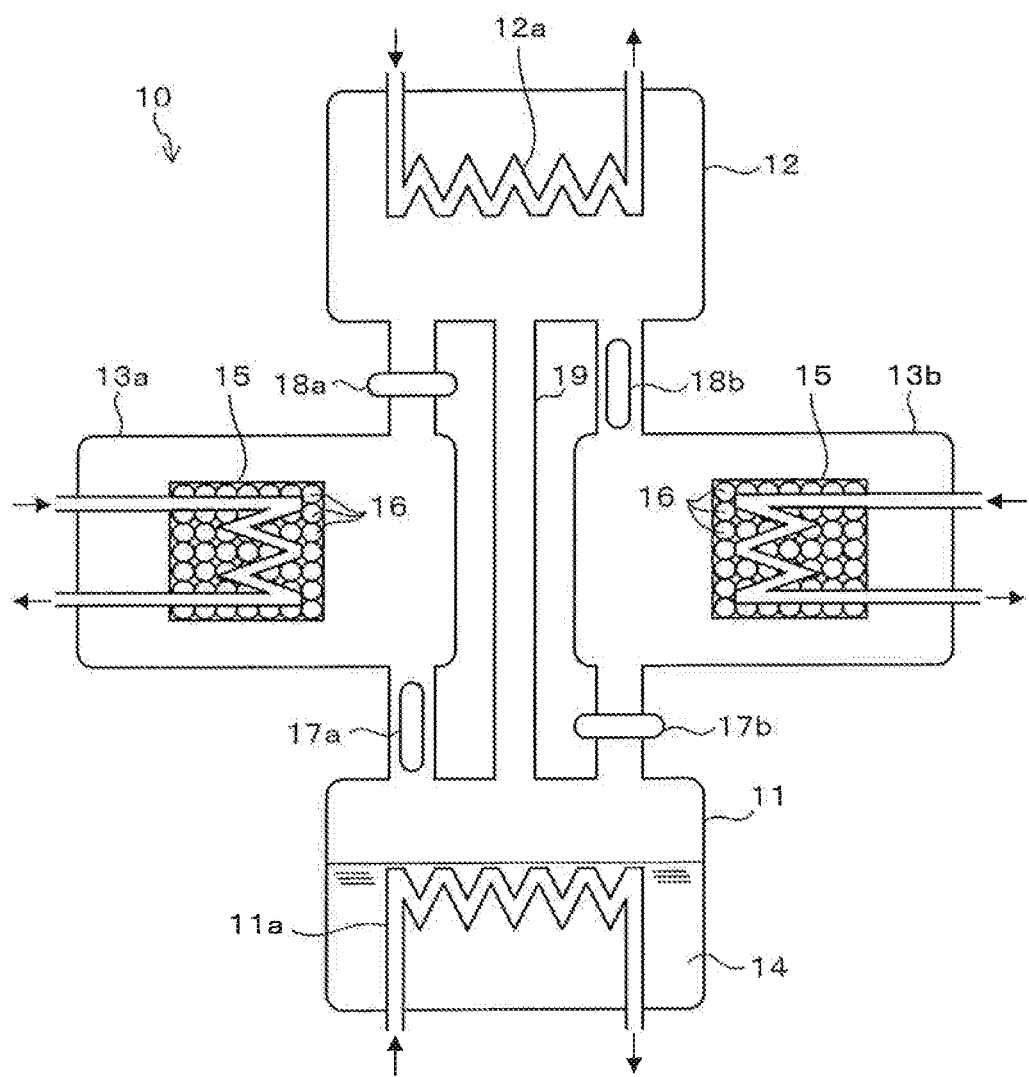
FIG. 7 is a schematic diagram illustrating states of valves of the adsorption heat pump in a second step.

After an elapse of a predetermined period from the start of the restoration step, the control unit 30 opens the valve 17a between the adsorber 13a and the evaporator 11, and the valve 18b between the adsorber 13b and the condenser 12 as illustrated in FIG. 7 in order to proceed to the second step. Meanwhile, the control unit 30 closes the valve 17b between the adsorber 13b and the evaporator 11, and the valve 18a between the adsorber 13a and the condenser 12.

Figure 8:
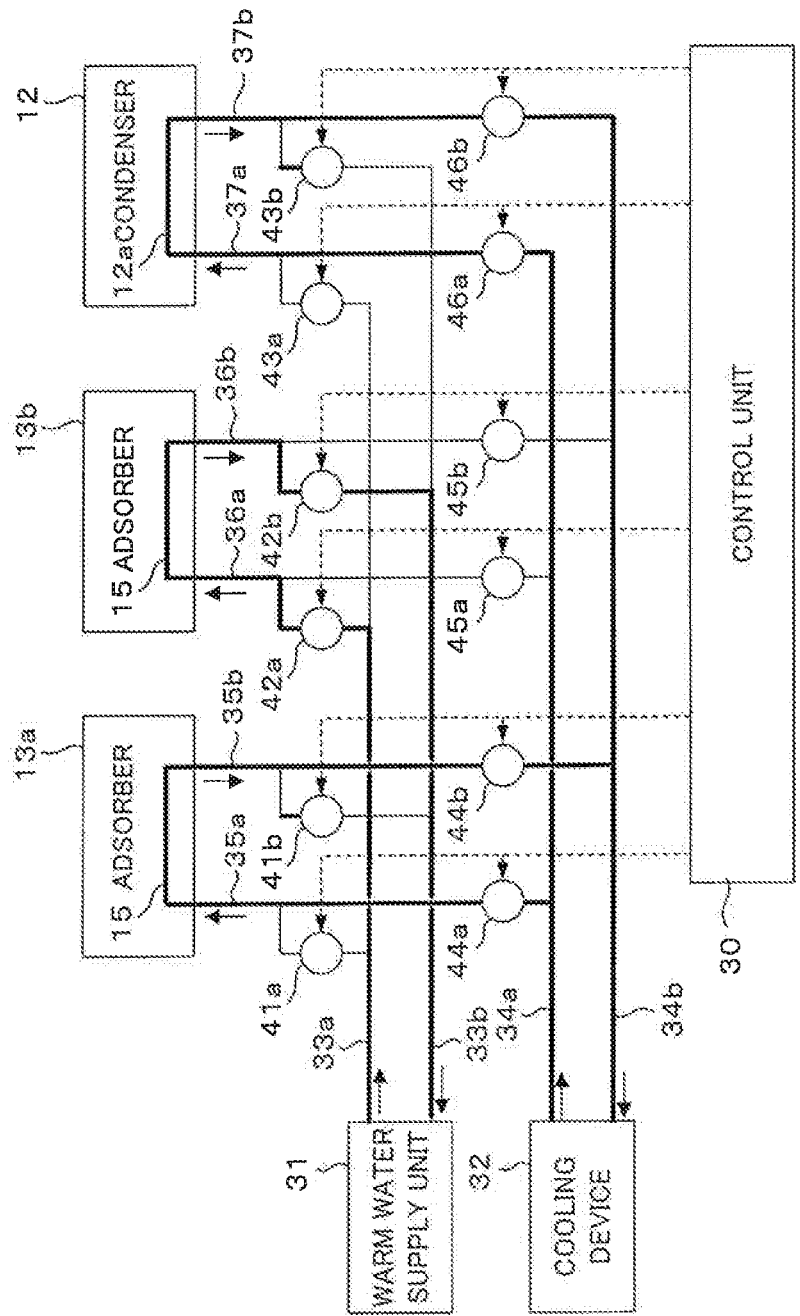
FIG. 8 is a diagram illustrating flow passages of the warm water and the cooling water in the second step.

Further, the control unit 30 opens the valves 42a, 42b, 44a, 44b, 46a, and 46b, and closes the valves 41a, 41b, 43a, 43b, 45a, and 45b. In this way, as illustrated in FIG. 8, the cooling water is supplied to the adsorber 13a and the condenser 12 while the warm water is supplied to the adsorber 13b.

In the second step, the water vapor generated in the evaporator 11 is adsorbed by the adsorbent 16 in the adsorber 13a. In the meantime, the moisture adsorbed by the adsorbent 16 in the adsorber 13b evaporates whereby the adsorbent 16 in the adsorber 13b is dried (recycled). The water vapor generated in association with the recycle of the adsorbent 16 passes through the opened pipe 18b and moves into the condenser 12. Then, the water vapor is condensed into water by means of the cooling water flowing inside the heat exchanger 12a.

Figure 9:
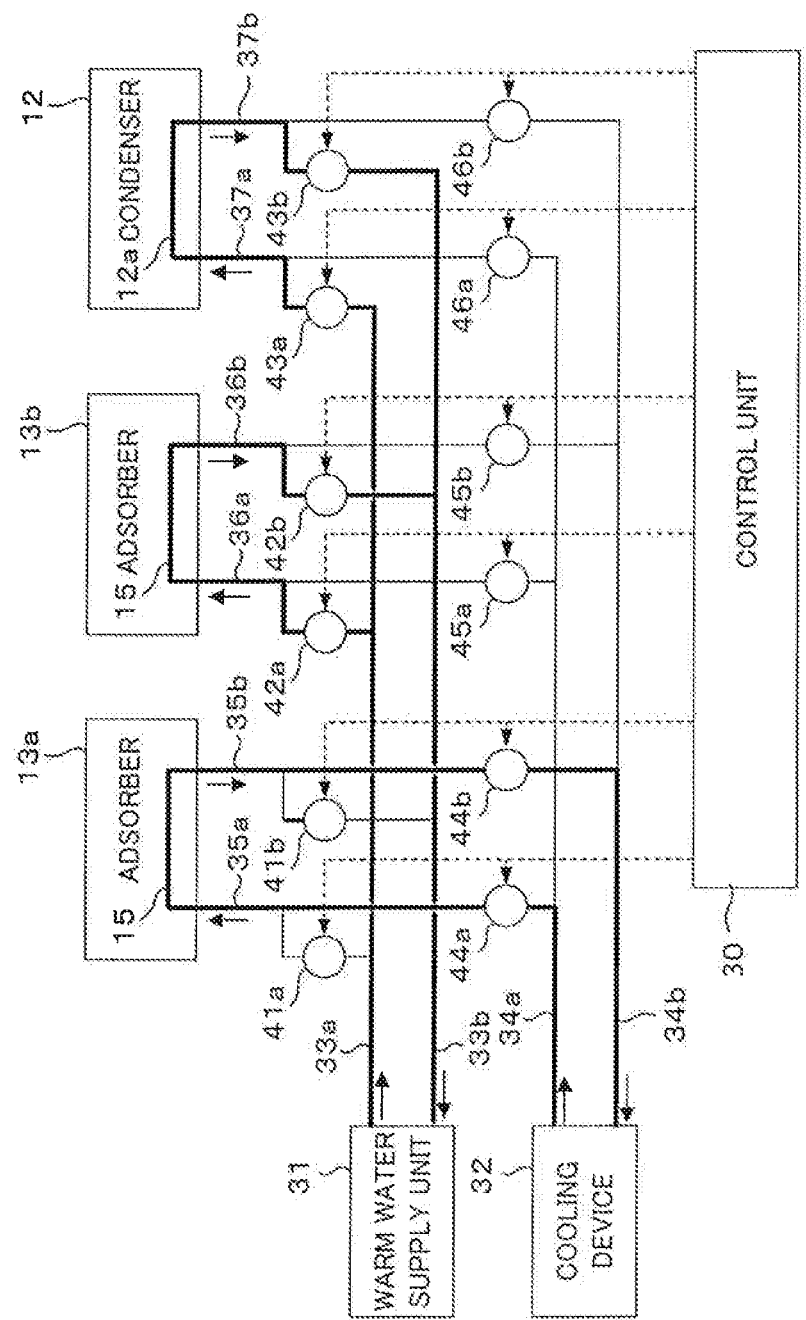
FIG. 9 is a diagram illustrating flow passages of the warm water and the cooling water in a restoration step subsequent to the second step.

After an elapse of a predetermined period from the start of the second step, the control unit 30 closes the valves 46a and 46b and opens the valves 43a and 43b in order to proceed to the restoration step. Thus, as illustrated in FIG. 9, the warm water flows through the heat exchanger 12a of the condenser 12 and the restoration step is executed.

As described above, in the first driving method, the restoration step is executed after the completion of the first step and after the completion of the second step. Hence, the water adhering to the heat exchanger 12a of the condenser 12 evaporates in each of the first step and the second step as a consequence. Thus, the heat exchange efficiency of the heat exchanger 12a is restored and an amount of coolant condensation per unit time in the condenser 12 may be maintained at a predetermined level or higher. As a consequence, the adsorption heat pump having a small size and a high cool water supply capacity is obtained.

(Second Driving Method) FIG. 10 is a cycle diagram illustrating a second driving method of the adsorption heat pump 10. The actions of the valves in the first step, the second step, and the restoration step are basically the same as those in the first driving method. Accordingly, description of the actions will be omitted herein.

As illustrated in FIG. 10, in the second driving method, the first step is followed by the second step, and the restoration step is executed for a predetermined period immediately before the completion of the second step.

When the amount of the water vapor to be condensed by the condenser 12 is large, it is preferable to execute the restoration step after the completion of the first step and after the completion of the second step. Nevertheless, if the amount of the water vapor to be condensed by the condenser 12 is not so large, then as in the second driving method, it may be possible to maintain the heat exchange efficiency of the heat exchanger 12a in the condenser 12 at the predetermined level or higher without executing the restoration step after the completion of the first step.

In the second driving method, the number of times of the restoration step is fewer than in the first driving method. Thus, an operating rate of the adsorption heat pump 10 is practically improved.

2. Second Embodiment

Figure 11:
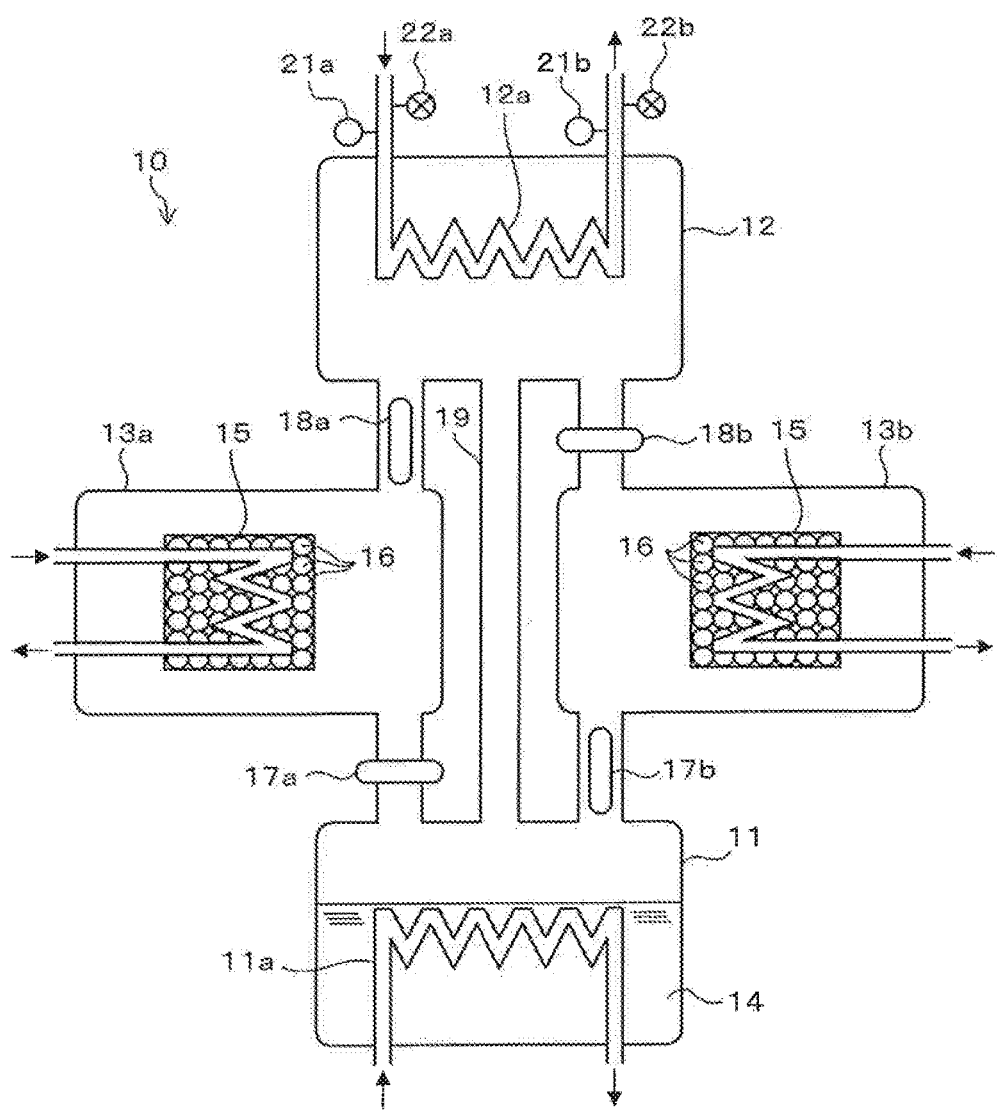
FIG. 11 is a schematic diagram of a main body portion of an adsorption heat pump according to a second embodiment.

FIG. 11 is a schematic diagram of a main body portion of an adsorption heat pump according to a second embodiment. In FIG. 11, the same constituents as those in FIG. 1 will be denoted by the same reference numerals and detailed description thereof will be omitted.

The inlet side pipe of the condenser 12 of the adsorption heat pump 10 of this embodiment is provided with a temperature sensor 21a which detects a temperature of the cooling water, and a flow rate sensor 22a which detects a flow rate of the cooling water. Meanwhile, the outlet side pipe of the condenser 12 is provided with a temperature sensor 21b which detects a temperature of the cooling water, and a flow rate sensor 22b which detects a flow rate of the cooling water.

Outputs from the temperature sensors 21a and 21b and the flow rate sensors 22a and 22b are sent to the control unit 30. The control unit 30 calculates an amount of condensation heat by the condenser 12 while using the outputs from the temperature sensors 21a and 21b and the flow rate sensors 22a and 22b.

FIG. 12 is a cycle diagram illustrating a method of driving the adsorption heat pump of this embodiment. As illustrated in FIG. 12, the control unit 30 executes the first step and the second step alternately at predetermined time intervals. Here, the control unit 30 calculates the amount of condensation heat per unit time by the condenser 12 on the basis of the outputs from the temperature sensors 21a and 21b and the flow rate sensors 22a and 22b. Then, if the amount of condensation heat per unit time by the condenser 12 falls below a preset value, the control unit 30 subsequently executes the restoration step.

In this embodiment, the restoration step is executed when the amount of condensation heat per unit time by the condenser 12 falls below the preset value. Thus, the operating rate of the adsorption heat pump 10 is even more practically improved than in the first embodiment.

Here, there is a relation between the amount of condensation heat by the condenser 12 and the cold heat output from the adsorption heat pump 10. Accordingly, the cold heat output may be calculated from the temperature and the flow rate of the cool water flowing into the evaporator 11 and the temperature and the flow rate of the cool water supplied from the evaporator 11, and the restoration step may be executed when the cold heat output falls below a predetermined value.

Alternatively, the restoration step may be executed when an amount of evaporation of the coolant by the adsorber (the adsorber 13a or the adsorber 13b), which is executing the step of drying the adsorbent, is larger than an amount of condensation of the coolant by the condenser 12. The amount of evaporation of the coolant in each of the adsorbers 13a and 13b may be measured by providing the temperature sensor and the flow rate sensor respectively on the inlet side and the outlet side of the heat exchanger 15 of each of the adsorbers 13a and 13b.

Experimental Example

An experiment is conducted in order to confirm an effect of the adsorption heat pump of this embodiment.

The adsorption heat pump used in the experiment has the structure illustrated in FIG. 1 with size dimensions of 450 mm×200 mm×500 mm. A heat exchanger having size dimensions of 120 mm×240 mm×30 mm and a fin pitch of 1 mm is placed in each of the evaporator 11, the condenser 12, and the adsorbers 13a and 13b.

Spherical activated carbon having a grain size of 400 μm is filled as the adsorbent 16 in each of the adsorbers 13a and 13b. Meanwhile, water in an amount of 400 g is enclosed as the coolant in the adsorption heat pump 10.

Figure 13:
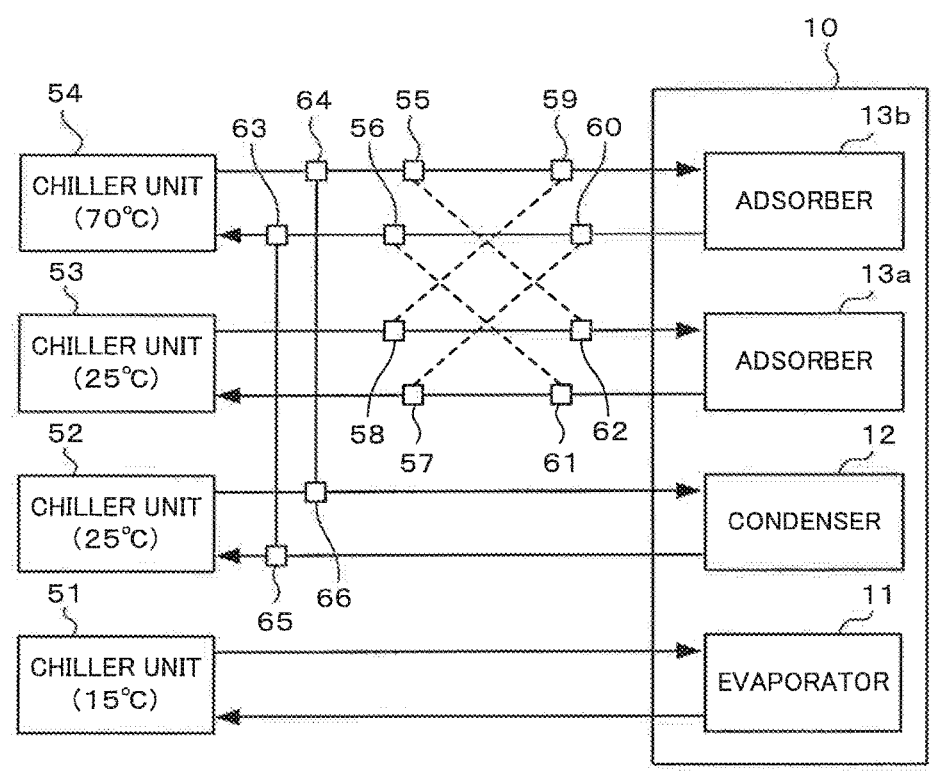
FIG. 13 is a diagram illustrating flow passages of warm water and cooling water in an experiment.

Four chiller units 51, 52, 53, and 54 are prepared as illustrated in FIG. 13. Cool water at a temperature of 15° C. is supplied from the chiller unit 51. Cooling water at a temperature of 25° C. is supplied from each of the chiller units 52 and 53. Warm water at a temperature of 70° C. is supplied from the chiller unit 54.

The cool water supplied from the chiller unit 51 circulates between the chiller unit 51 and the evaporator 11. A temperature sensor and a flow rate sensor are attached to an inlet side and an outlet side of the cool water pipe 11a of the evaporator 11 so that the cold heat output from the adsorption heat pump 10 may be able to be measured.

Meanwhile, the adsorbers 13a and 13b are provided with piping such that the cooling water or the warm water may be able to be supplied from any of the chiller units 53 and 54 through switch valves 55 to 62. Further, the condenser 12 is provided with piping such that the cooling water or the warm water may be able to be supplied from any of the chiller units 54 and 52 through switch valves 63 to 66.

As an example, a period for each of the first step and the second step is set to 20 minutes and the restoration step is executed when the cold heat output decreases to 15% of a value in an initial state. Thus, a temporal change in the cold heat output is investigated.

In the meantime, as a comparative example, a temporal change in the cold heat output is examined while alternately repeating the first step and the second step without executing the restoration step.

Figure 14:
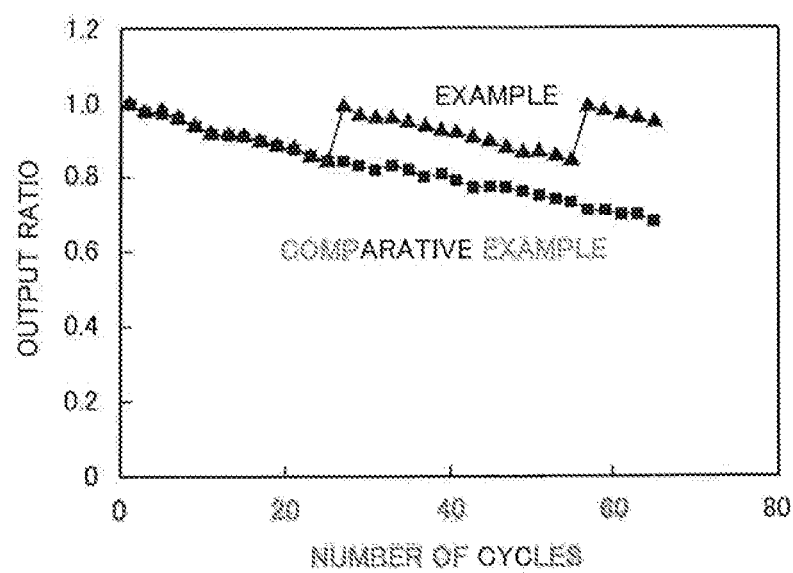
FIG. 14 is a graph illustrating results of examination of temporal changes in cold heat outputs in an example and in a comparative example.

FIG. 14 is a graph illustrating results of the examination of the temporal, changes in the cold heat outputs in the example and in the comparative example, in which the horizontal axis indicates the number of cycles and the vertical axis indicates the cold heat output (an output ratio). In FIG. 14, the cold heat output in an initial state is set to 1. In addition, one cycle is defined as a period for executing the first step once and the second step once.

As learned in FIG. 14, in the example, the cold heat output is restored to the initial state by executing the restoration step, and the output ratio is maintained at 0.8 or above in spite of an increase in the number of cycles. On the other hand, in the comparative example, the cold heat output decreases in accordance with the increase in the number of cycles, and the output ratio decreases by about 30% as compared to the initial state after an elapse of 65 cycles (after 1300 minutes). This experiment is proved the usability of the techniques disclosed herein.

3. Third Embodiment

Figure 15:
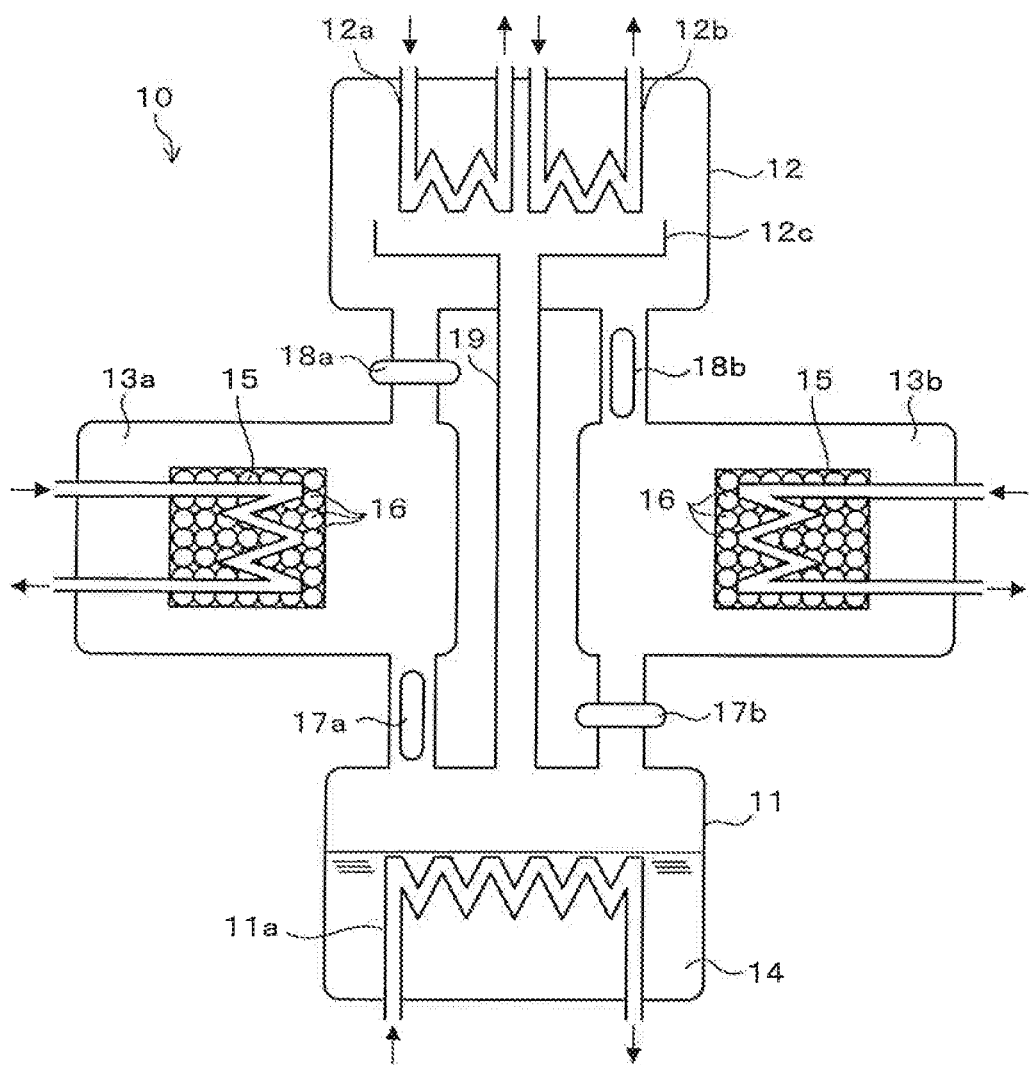
FIG. 15 is a schematic diagram of a main body portion of an adsorption heat pump according to a third embodiment.
Figure 16:
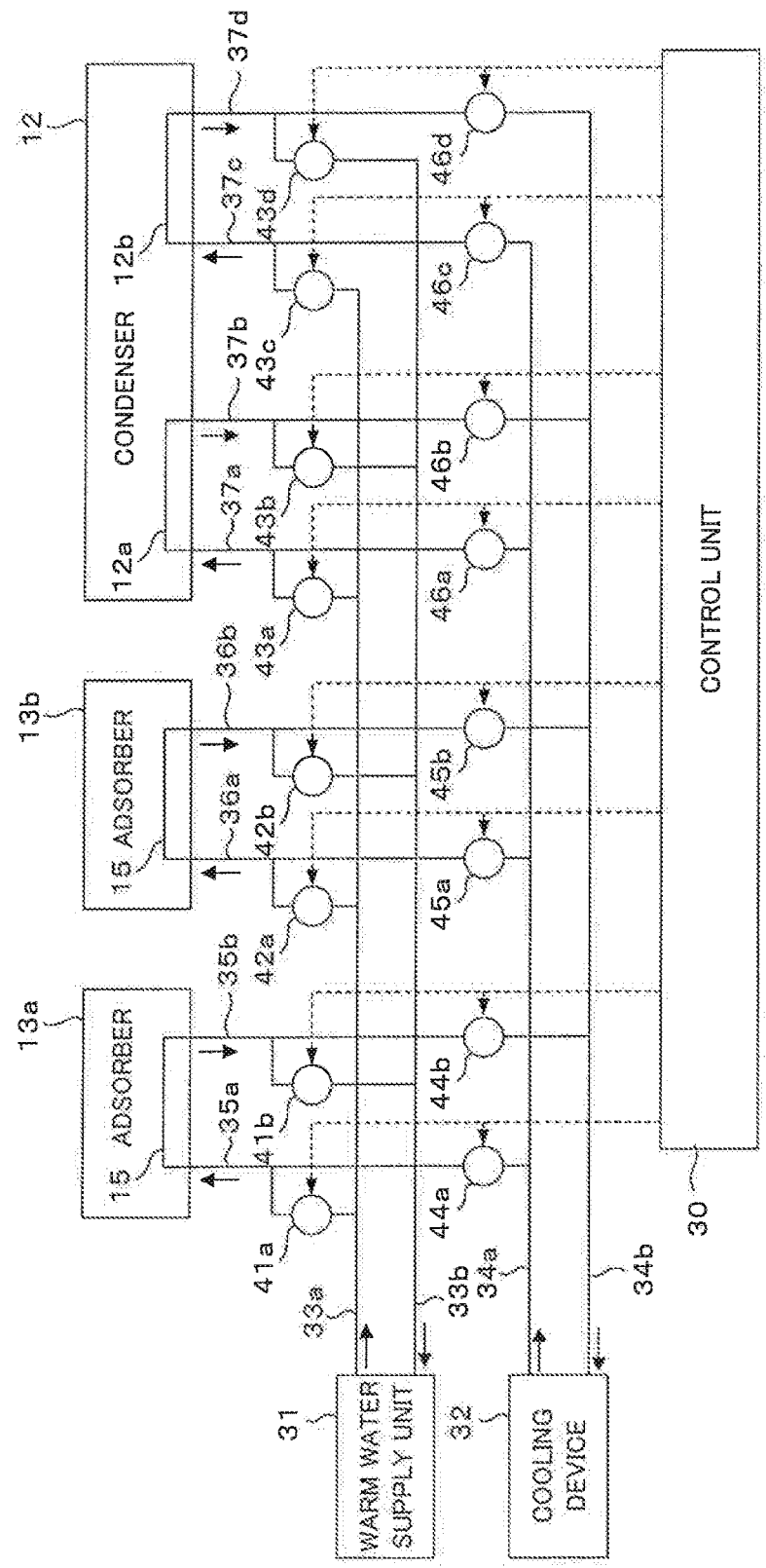
FIG. 16 is a schematic diagram illustrating a control system of the adsorption heat pump according to the third embodiment.

FIG. 15 is a schematic diagram of a main body portion of an adsorption heat pump 10 according to a third embodiment, and FIG. 16 is a schematic diagram illustrating a control system of the adsorption heat pump 10. In FIGS. 15 and 16, the same constituents as those in FIGS. 1 and 2 will be denoted by the same reference numerals and detailed description thereof will be omitted.

As illustrated in FIG. 15, in the adsorption heat pump 10 of this embodiment, two heat exchangers 12a and 12b are placed in the condenser 12.

In addition, a tray 12c for receiving the water condensed by the heat exchangers 12a and 12b and guiding the water to the pipe 19 is placed below the heat exchangers 12a and 12b. The tray 12c prevents the water condensed by the heat exchangers 12a and 12b from passing through the opened valve 18b (or the valve 18a) and flowing into the adsorber 13b (or the adsorber 13a). Note that a similar tray may also be provided in the condenser 12 of the adsorption heat pump of the first embodiment or the second embodiment.

As illustrated in FIG. 16, the inlet side pipe 37a of the heat exchanger 12a is connected to the warm water supply pipe 33a through the valve 43a. The inlet side pipe 37a of the heat exchanger 12a is connected to the cooling water supply pipe 34a through the valve 46a.

Moreover, the outlet side pipe 37b of the heat exchanger 12a is connected to the warm water return pipe 33b through the valve 43b. The outlet side pipe 37b of the heat exchanger 12a is connected to the cooling water return pipe 34b through the valve 46b.

Similarly, an inlet side pipe 37c of the heat exchanger 12b is connected to the warm water supply pipe 33a through a valve 43c. The Inlet side pipe 37c of the heat exchanger 12b is connected to the cooling water supply pipe 34a through a valve 46c.

Moreover, an outlet side pipe 37d of the heat exchanger 12b is connected to the warm water return pipe 33b through a valve 43d. The outlet side pipe 37d of the heat exchanger 12b is connected to the cooling water return pipe 34b through a valve 46d.

The valves 43a to 43d and 46a to 46d are also opened and closed in accordance with signals outputted from the control unit 30.

FIG. 17 is a cycle diagram illustrating a method of driving the adsorption heat pump 10 of this embodiment. Here, a period when the warm water is supplied to the adsorber 13a and the cooling water is supplied to the adsorber 13b will be referred to as a first step. Meanwhile, a period when the cooling water is supplied to the adsorber 13a and the warm water is supplied to the adsorber 13b will be referred to as a second step.

As illustrated in FIG. 17, the control unit 30 repeatedly executes the first step and the second step by controlling the valves 17a, 17b, 18a, 18b, 41a, 41b, . . . , 46a, and 46b. When a condensation performance of the condenser 12 is judged to decrease, the control unit 30 executes the restoration step late in the first step and late in the second step.

As previously described in the second embodiment, for example, the judgment as to whether or not the amount of condensation by the condenser 12 decreases is made by calculating the amount of condensation heat per unit time by the condenser 12 and then judging whether or not the amount is equal to or below a predetermined value. Instead, the decrease in the condensation performance by the condenser 12 may be detected based on whether or not the cold heat output of the cold water supplied from the evaporator 11 is equal to or below a predetermined value. Meanwhile, the decrease in the condensation performance by the condenser 12 may be detected by using the amount of evaporation of the coolant by the adsorber (the adsorber 13a or the adsorber 13b), which is executing the step of drying the adsorbent, and using the amount of condensation of the coolant by the condenser 12.

In the example illustrated in FIG. 17, the decrease in the amount of condensation by the condenser 12 is detected in the course of executing a certain first step, and the restoration step is executed late in a subsequent second step and late in a subsequent first step, respectively.

Figure 18:
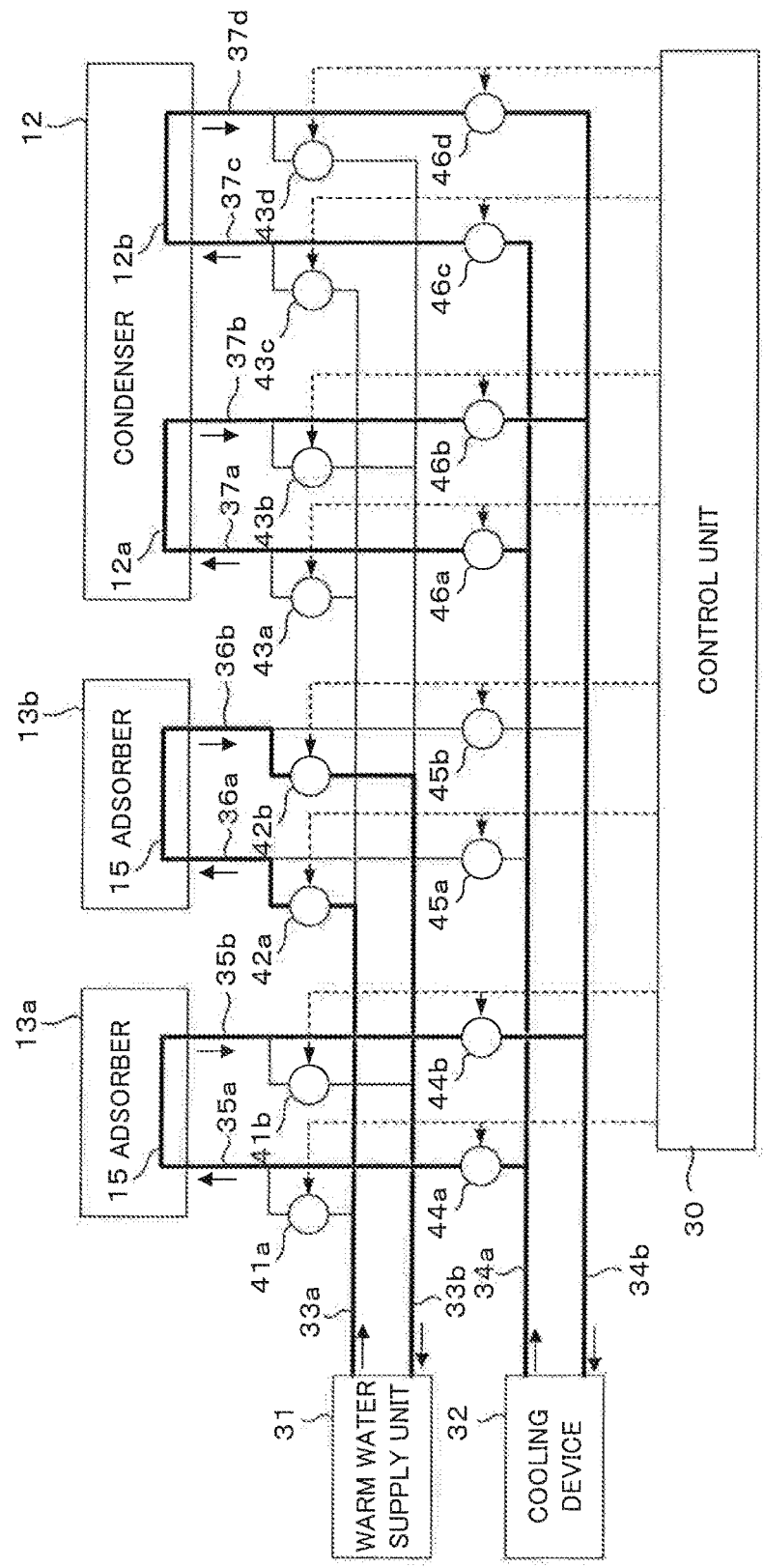
FIG. 18 is a diagram illustrating flows of the cooling water and the warm water immediately after the second step is started.

FIG. 18 is a diagram illustrating flows of the cooling water and the warm water immediately after the second step is started. As illustrated in FIG. 18, in the second step, the cooling water is supplied to the adsorber 13a and the warm water is supplied to the adsorber 13b.

At a point immediately after the start of the second step, all the valves 43a to 43d are closed whereas all the valves 46a to 46d are opened. Hence, the cooling water flows through both the heat exchangers 12a and 12b in the condenser 12.

Figure 19:
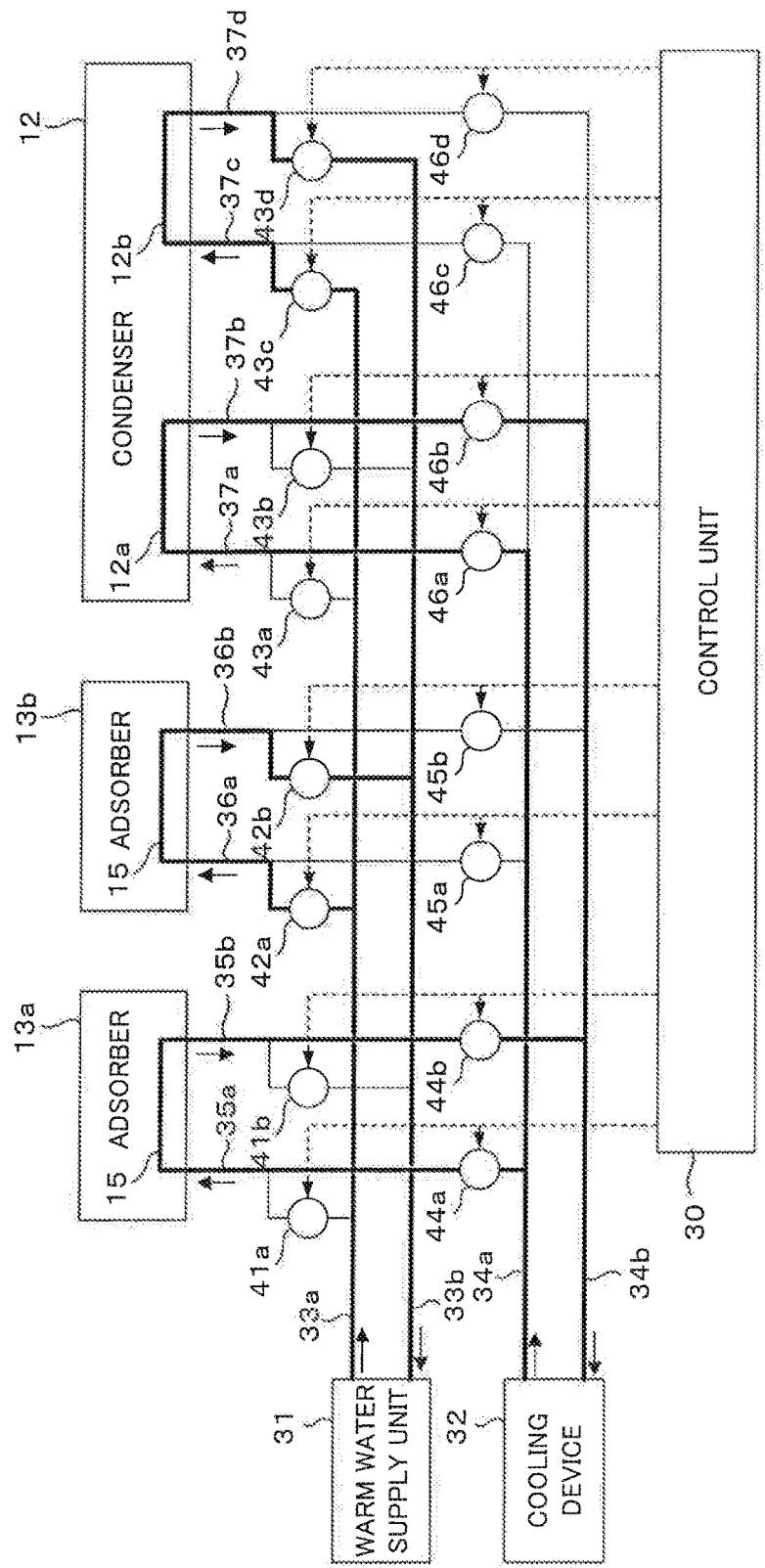
FIG. 19 is a diagram illustrating flows of the cooling water and the warm water later in the second step.

Later in the second step, the control unit 30 opens the valves 43c and 43d and closes the valves 46c and 46d as illustrated in FIG. 19 in order to execute the restoration step on the heat exchanger 12b. Accordingly, the warm water flows through the heat exchanger 12b, whereby the moisture adhering to the fins of the heat exchanger 12b either evaporates or drips off by vibration of the moisture associated with the evaporation. As a consequence, the heat exchange efficiency of the heat exchanger 12b is restored.

While the warm water flows through the heat exchanger 12b, the cooling water keeps flowing through the heat exchanger 12a. The water vapor generated in the adsorber 13b and entering the condenser 12, or the water vapor generated in the heat exchanger 12b, is cooled and condensed by the heat exchanger 12a.

After an elapse of a predetermined period from the start of the restoration step, the control unit 30 controls the valves 17a, 17b, 18a, 18b, 41a, 41b, . . . , 46a, and 46b in order to proceed to the first step.

Figure 20:
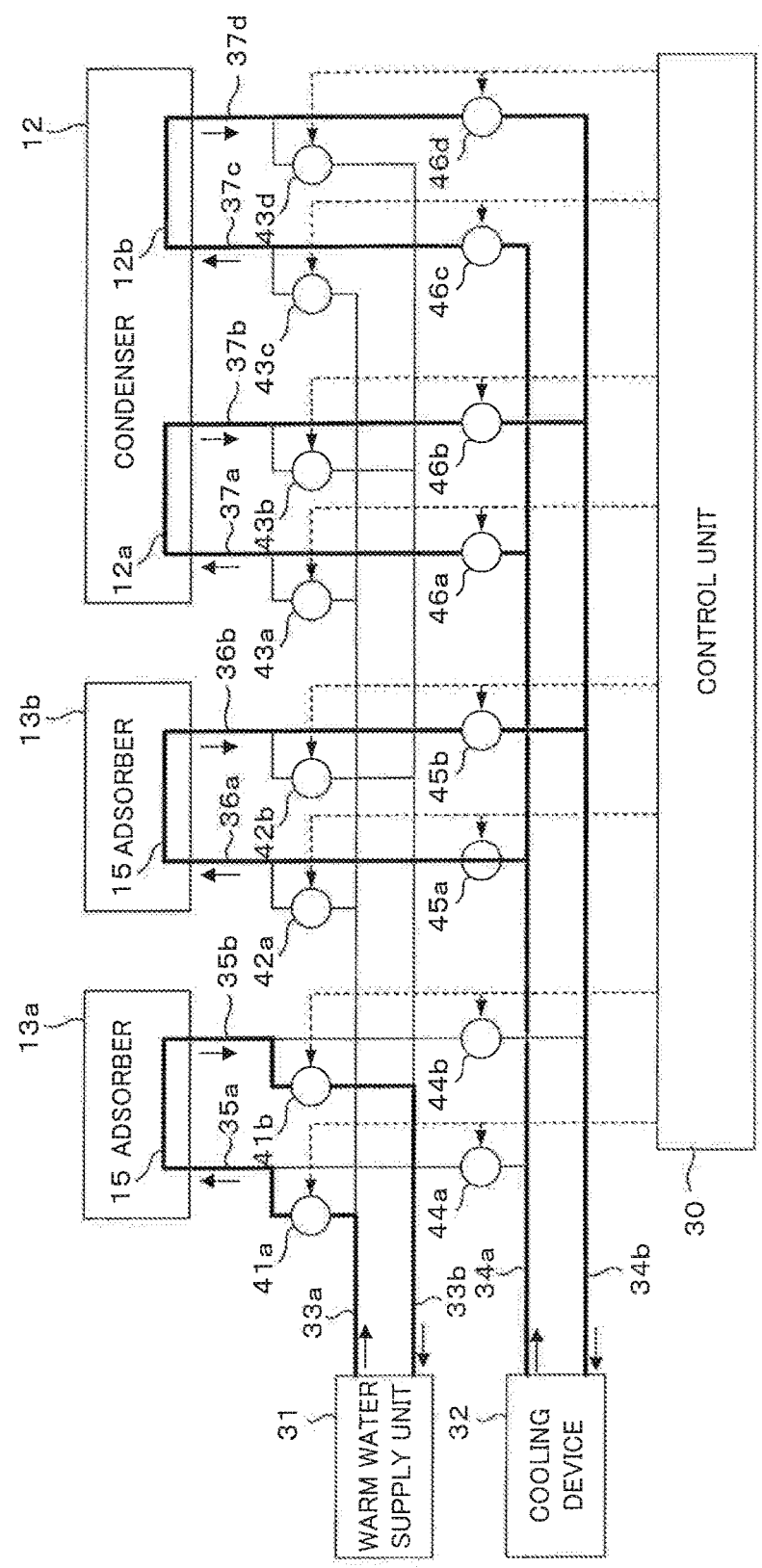
FIG. 20 is a diagram illustrating flows of the cooling water and the warm water immediately after the first step is started.

FIG. 20 is a diagram illustrating flows of the cooling water and the warm water immediately after the first step is started. As illustrated in FIG. 20, in the first step, the warm water is supplied to the adsorber 13a and the cooling water is supplied to the adsorber 13b.

At a point immediately after the start of the first step, all the valves 43a to 43d are closed whereas all the valves 46a to 46d are opened. Hence, the cooling water flows through both the heat exchangers 12a and 12b in the condenser 12.

Figure 21:
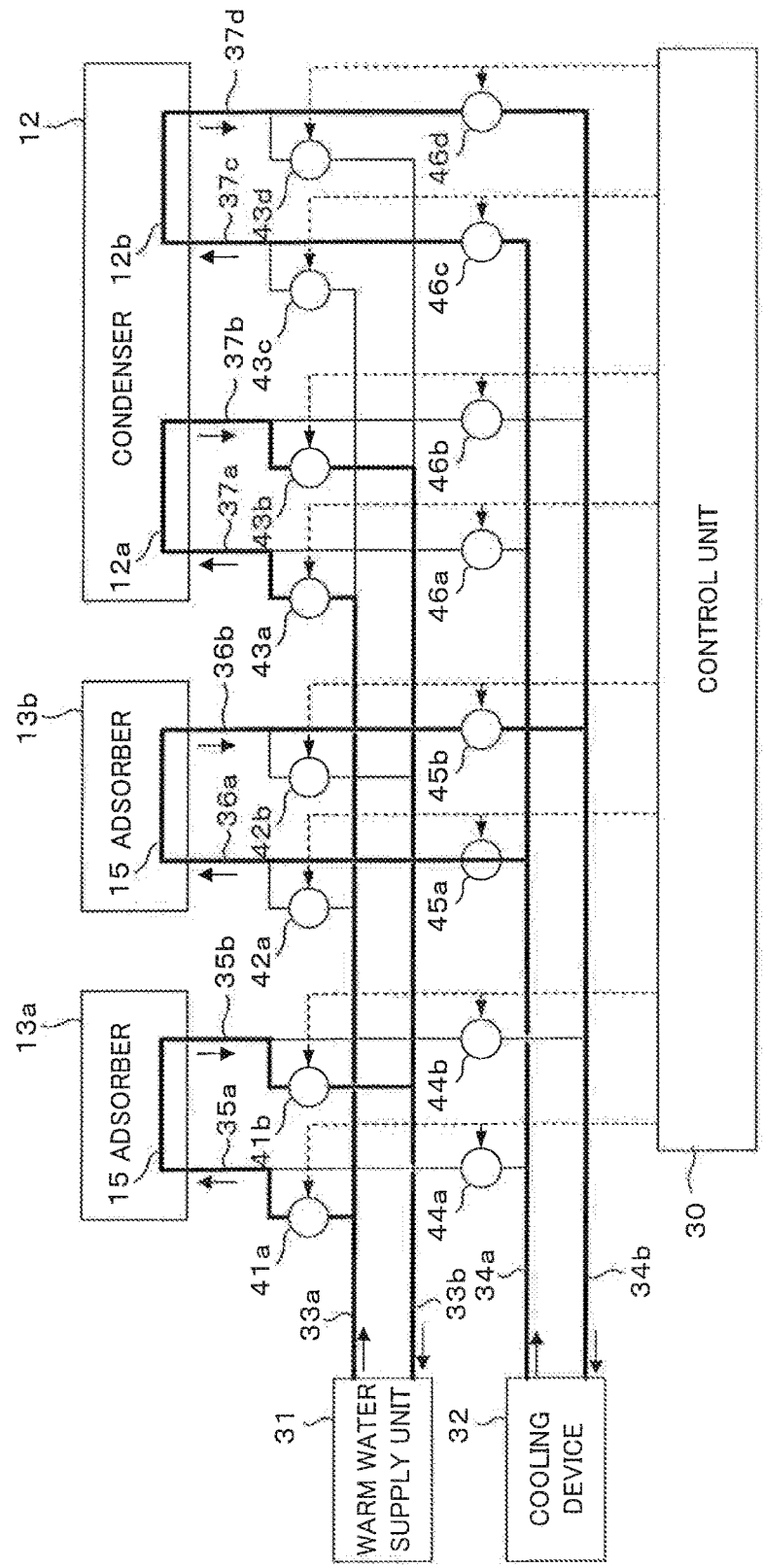
FIG. 21 is a diagram illustrating flows of the cooling water and the warm water later in the first step.

Later in the first step, the control unit 30 opens the valves 43a and 43b and closes the valves 46a and 46b as illustrated in FIG. 21 in order to execute the restoration step on the heat exchanger 12a. Accordingly, the warm water flows through the heat exchanger 12a, whereby the moisture adhering to the fins of the heat exchanger 12a either evaporates or drips off by vibration of the moisture associated with the evaporation. As a consequence, the heat exchange efficiency of the heat exchanger 12a is restored.

While the warm water flows through the heat exchanger 12a, the cooling water keeps flowing through the heat exchanger 12b. The water vapor generated in the adsorber 13a and entering the condenser 12, or the water vapor generated in the heat exchanger 12a, is cooled and condensed by the heat exchanger 12b.

After the restoration steps on the heat exchangers 12a and 12b in the condenser 12 are executed as described above, the control unit 30 repeatedly executes the first step and the second step until the amount of condensation by the condenser 12 is reduced again.

In the first embodiment and the second embodiment described above, there is the one heat exchanger in the condenser 12. Accordingly, when the warm water is flowing through the heat exchanger, the condenser 12 does not condense the moisture. Part of the water vapor entering the condenser 12 further enters the evaporator 11 and is condensed in the evaporator 11. In this case, the temperature inside the evaporator 11 may rise and the temperature of the cool water flowing out of the evaporator 11 may rise accordingly.

On the other hand, in this embodiment, the two heat exchangers 12a and 12b are provided in the condenser 12. While one of the heat exchangers is executing the restoration step, the other heat exchanger continues to condense the water vapor. For this reason, the adsorption heat pump of this embodiment has a higher operating rate than the adsorption heat pumps of the first and second embodiments, and is also safe from a rise in temperature of the cool water flowing out of the evaporator 11.

The condensation performance by the condenser 12 decreases when the restoration step for the heat exchanger 12a or 12b is executed. Meanwhile, a large amount of water vapor enters the condenser 12 from the adsorber (the adsorber 13a or the adsorber 13b) immediately after the switching from the first step to the second step or from the second step to the first step.

For this reason, if the restoration step is executed immediately after the switching from the first step to the second step or from the second step to the first step, the large amount of water vapor entering the condenser 12 from the adsorber is not properly condensed by the condenser 12. Accordingly, as described in this embodiment, it is preferable to execute the restoration step either later in the first step or later in the second step, when the amount of water vapor entering the condenser 12 from the adsorber drops off.

Although the restoration step is executed in the above-described embodiment when the decrease in the amount of condensation by the condenser 12 is detected, the restoration step may be executed at predetermined time intervals instead.

In addition, although the two heat exchangers are placed in the condenser 12 in the above-described embodiment, three or more heat exchangers may be placed in the condenser 12 instead. In the latter case, when the condensation performance by the condenser 12 falls below a preset value, the control unit 30 restores the performance by one or more heat exchangers by feeding the warm water to the one or more heat exchangers while feeding the cooling water to the rest of the heat exchangers.

In this case, if the number of the heat exchangers fed with the warm water is larger than the number of the heat exchangers fed with the cooling water, the water vapor is not sufficiently condensed in the condenser 12, and the water vapor may pass through the pipe 19 and enter the evaporator 11. For this reason, it is preferable that the number of the heat exchangers fed with cooling water be set equal to or larger than the number of the heat exchangers fed with the warm water.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. An adsorption heat pump comprising:
an evaporator configured to generate vapor of a coolant;

a first adsorber and a second adsorber each containing an adsorbent to adsorb the vapor of the coolant generated in the evaporator;

a condenser configured to condense the vapor of the coolant generated in any of the first adsorber and the second adsorber; and a control unit configured to feed the condenser with cooling water for condensation of the vapor of the coolant, and to feed the condenser with warm water for evaporation of the coolant at predetermined timing, wherein the condenser is connected to a cooling water supply source and a warm water supply source, and when the control unit feeds the condenser with the cooling water, the control unit supplies the cooling water from the cooling water supply source to the condenser, and returns the cooling water, which is passed through the condenser, to the cooling water supply source, and when the control unit feeds the condenser with the warm water, the control unit supplies the warm water from the warm water supply source to the condenser, and returns the warm water, which is passed through the condenser, to the warm water supply source.

2. The adsorption heat pump according to claim 1, wherein the control unit alternately feeds the cooling water and the warm water to the condenser at predetermined time intervals.

3. The adsorption heat pump according to claim 1, wherein when the cooling water is fed to the condenser, the control unit feeds the warm water to the condenser in any one of the following conditions where an amount of condensation heat per unit time by the condenser becomes equal to or below a predetermined value, where a cold heat output of the evaporator becomes equal to or below a predetermined value, and where an amount of evaporation of the coolant by any one of the first adsorber and the second adsorber becomes larger than an amount of condensation of the coolant by the condenser.

4. The adsorption heat pump according to claim 1, further comprising:

a first heat exchanger and a second heat exchanger, each placed in the condenser and configured to be fed with any of the cooling water and the warm water, wherein the control unit feeds the cooling water to the second heat exchanger when feeding the warm water to the first heat exchanger, and the control unit feeds the cooling water to the first heat exchanger when feeding the warm water to the second heat exchanger.

5. The adsorption heat pump according to claim 4, wherein when the cooling water is fed through both the first heat exchanger and the second heat exchanger, the control unit feeds the warm water to the first heat exchanger and the second heat exchanger one by one in any of conditions where an amount of condensation heat per unit time by the condenser becomes equal to or below a predetermined value, where a cold heat output of the evaporator becomes equal to or below a predetermined value, and where an amount of evaporation of the coolant by any one of the first adsorber and the second adsorber becomes larger than an amount of condensation of the coolant by the condenser.

6. The adsorption heat pump according to claim 1, wherein the control unit supplies the cooling water from the cooling water supply source to one of the first adsorber and the second adsorber, the control unit supplies the warm water from the warm water supply source to the other one of the first adsorber and the second adsorber, and the control unit switches the adsorber to be supplied with the warm water and the adsorber to be supplied with the cooling water in a predetermined order.

7. The adsorption heat pump according to claim 1, comprising a plurality of heat exchangers placed in the condenser, wherein when a condensation performance of the condenser falls below a preset value, the control unit feeds the warm water to one or more of the heat exchangers among the plurality of the heat exchangers, and feeds the cooling water to the remaining heat exchangers of a number equal to or larger than the number of the one or more of the heat exchangers.

* * * * *